(12) United States Patent
Komatsu et al.

(10) Patent No.: US 7,432,732 B2
(45) Date of Patent: Oct. 7, 2008

(54) INTEGRATED CIRCUIT DEVICE INCLUDING INTERFACE CIRCUIT AND ELECTRONIC APPARATUS

(75) Inventors: Fumikazu Komatsu, Okaya (JP); Yasunari Furuya, Fujimi (JP); Kiminori Nakajima, Fujimi (JP)

(73) Assignee: Seiko Epson Corporation (JP)

( * ) Notice: Subject to any disclaimer, the term of this patent is extended or adjusted under 35 U.S.C. 154(b) by 109 days.

(21) Appl. No.: 11/426,119

(22) Filed: Jun. 23, 2006

(65) Prior Publication Data
US 2007/0008005 A1    Jan. 11, 2007

(30) Foreign Application Priority Data
Jul. 6, 2005    (JP)    ............................. 2005-197930

(51) Int. Cl.
    *H03K 19/0175* (2006.01)
(52) U.S. Cl. ......................... 326/37; 326/101; 326/82
(58) Field of Classification Search ............. 326/37–41, 326/100, 101, 82
    See application file for complete search history.

(56) References Cited

U.S. PATENT DOCUMENTS 6,002,268 A * 12/1999 Sasaki et al. .................. 326/41
6,625,795 B1 * 9/2003 Anderson et al. ............. 716/16

FOREIGN PATENT DOCUMENTS

JP    2001-144091    5/2001
JP    2002-049052    2/2002

* cited by examiner

*Primary Examiner*—Don P Le
(74) *Attorney, Agent, or Firm*—Harness, Dickey & Pierce, P.L.C.

(57) ABSTRACT

An integrated circuit device, includes: an input pad region including a differential signal input region receiving a pair of differential signals, a first power supply input region and a second power supply input region; and an interface circuit including a receiving circuit receiving the pair of differential signals that are input from the input pad region, wherein the first power supply input region and the second power supply input region are disposed in a direction along one side of the interface circuit so as to sandwich the differential signal input region.

15 Claims, 11 Drawing Sheets

INTEGRATED CIRCUIT DEVICE INCLUDING INTERFACE CIRCUIT AND ELECTRONIC APPARATUS

BACKGROUND

1. Technical Field

The present invention relates to an integrated circuit device including an interface circuit, and an electronic apparatus.

2. Related Art

A driver IC including an interface circuit, e.g. a high-speed serial interface circuit, has not been realized yet. If a high-speed serial interface circuit is included in a driver IC, external noise becomes a serious problem to a pair of differential signals when the signals, which have small amplitude, are highly speeded particularly by serial transfer. Shielding measures on a substrate capable having multilayered wiring are disclosed in JP-A-2002-49052 as a first example of related art, while a shield between an analog signal line and a digital signal line is disclosed in JP-A-2001-144091 as a second example of related art.

SUMMARY

An advantage of the invention is to provide an integrated circuit device including an interface circuit equipped with a structure in which pairs of differential signals are protected from external noise or crosstalks among a plurality of pairs of differential signal lines can be prevented even if the integrated circuit device is mounted on a substrate having a single layer printed pattern.

Another advantage of the invention is to provide an electronic apparatus having a structure in which pairs of differential signals are protected from external noise on a substrate or crosstalks among a plurality of pairs of differential signal lines can be prevented even if an integrated circuit device including an interface circuit is mounted on a substrate having a single layer printed pattern.

An integrated circuit device according to a first aspect of the invention includes: an input pad region including a differential signal input region receiving a pair of differential signals, a first power supply input region and a second power supply input region; and an interface circuit including a receiving circuit receiving the pair of differential signals that are input from the input pad region. The first power supply input region and the second power supply input region are disposed in a direction along one side of the interface circuit so as to sandwich the differential signal input region.

According to the first aspect of the invention, the differential signal region is less influenced by external noise (EMI noise, voltage noise caused by electric field, current noise caused by magnetic field, and etc.) since the first and second power supply regions, in which power supply voltages are kept constant, are disposed. As a result, a highly speeded differential signal having a small amplitude can be transmitted without error.

It is preferable that each of the first power supply input region and the second power supply input region include a first power supply voltage input pad to which a first power supply voltage is input, and a second power supply voltage input pad to which a second power supply voltage higher than the first power supply voltage is input. Obviously, it may be acceptable one of the first power supply voltage input pad and the second power supply voltage input pad is disposed in the first power supply input region and the other is disposed in the second power supply input region. It is preferable that the first power supply voltage input pad being disposed so as to be closer to the differential signal input region than the second power supply voltage input pad in each of the first power supply input region and the second power supply input region. Typically, the first voltage is VSS voltage. Thus, at least one pair of differential signals is effectively guarded.

It is preferable that the differential signal input region include a first differential signal input pad to which one of the pair of differential signals is input and a second differential signal input pad to which the other of the pair of differential signals is input.

An integrated circuit device according to a second aspect of the invention includes: an input pad region including a plurality of differential signal regions each having a first differential signal input pad and a second differential signal input pad that receive a pair of differential signals, first through $m^{th}$ power supply regions including a $k^{th}$ power supply region, the regions being arranged in a direction along one side of the interface circuit so as to sandwich each of the plurality of differential signal regions; and an interface circuit including a receiving circuit receiving the pair of differential signals that are input from the input pad region. Each of the first power supply region and the mth power supply region is disposed at respective end parts in the direction, and has a first power supply voltage input pad to which a first power supply voltage is input, and a second power supply voltage input pad to which a second power supply voltage higher than the first power supply voltage is input. The $k^{th}$ power supply input region disposed between the differential signal regions so as to be sandwiched has at least the first power supply input pad. Here, m is a natural number of more than two, and k is a natural number of more than one and less than m.

Accordingly, the crosstalks among the plurality of pairs of differential signals can be prevented since the first and second power supply input regions are indispensably exist both sides of one pair of differential signals. In addition, characteristic impedance to at least one pair of differential signals can also be adjusted by using a wiring line for the first power supply voltage on a substrate on which the integrated circuit device is mounted.

It is preferable that each of the first differential signal input pad, the second differential signal input pad, the first power supply voltage input pad, and the second power supply voltage input pad include a first pad and a second pad both of which are electrically conducted and each of two probes make contact with each of the first pad and the second pad.

Accordingly, the resistance value of the terminating resistor can be measured with high accuracy by a four-terminal method using the first and second pads, two current supply terminals, and two voltage measurement terminals.

It is preferable that the interface circuit include a terminating resistor connected to the first differential signal input pad and the second differential signal input pad.

The terminating resistor sometimes needs an accurate resistance value. In such case, it is preferable that the terminating resistor include first through Nth resistors that are parallel connected, and first through nth cutting elements each of which is connected in series with each of n number of resistors in the first through Nth resistors where N is an integer more than one and n satisfies the relation of $1 \leq n < N$.

Accordingly, the resistance value of the terminating resistor can be adjusted with high accuracy by changing the number of resistance elements parallel connected according to whether or not each of n number of cutting elements is cut. In addition, the resistance value of the terminating resistor can be assured by the adjustment including variations in temperature and processes in manufacturing the integrated circuit device into which the interface circuit is built since the terminating resistor is fabricated in the interface circuit.

It is preferable that the interface circuit include a pull down resistor or a pull up resistor instead of the terminating resistor. The pull down resistor or pull up resistor is connected to either the first differential signal input pad or the second differential signal input pad.

If the integrated circuit device is a surface mount type, it is preferable that a bump being formed on each of the first pad and the second pad.

An electronic apparatus according to a third aspect of the invention includes: the integrated circuit device according to claim 4; and a substrate on which the integrated circuit device is mounted, the substrate having a signal pattern composed of a single layer, wherein the signal pattern is patterned in accordance with an arrangement order of the first differential signal input pad, the second differential signal input pad, the first power supply voltage input pad, and the second power supply voltage input pad that are arranged in the input pad region of the integrated circuit device.

Accordingly, a pair of differential signals is guarded by the arrangement of signal lines even in a case where only signal pattern composed of a single layer is formed on a substrate.

The integrated circuit device may be surface mounted to a substrate with a bump therebetween. In a case where the substrate is, for example, a glass substrate, it is preferable that the integrated circuit device being surface mounted with a bump included in the integrated circuit device. If the substrate is the glass substrate, it is preferable that a flexible circuit substrate being connected to the substrate for signal transmission to a host.

BRIEF DESCRIPTION OF THE DRAWINGS

The invention will be described with reference to the accompanying drawings, wherein like numbers refer to like elements, and wherein.

DESCRIPTION OF EXEMPLARY EMBODIMENTS

Herein after, an embodiment according to the invention will be explained with reference to the drawings. It should be noted that the embodiment shown below is not intended to unreasonably limit the scope of the invention as set forth in the appended claims. Also, it should be understood that not all of the elements described below are required to put the invention into practice. Note that like numerals indicate like elements throughout the drawings.

1. Display Driver

Figure 1A:
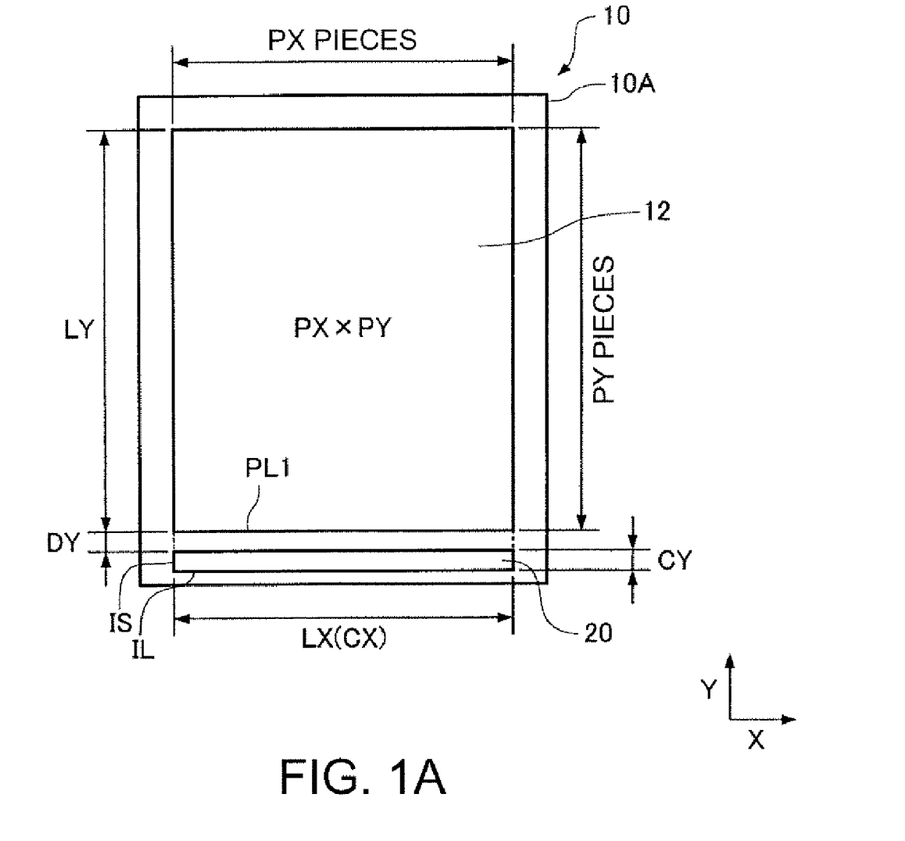
FIGS. 1A and 1B show an integrated circuit device according to one embodiment of the invention.

FIG. 1A shows a display panel 10 in which a display driver 20 (integrated circuit device in a broad sense) is mounted. In the embodiment, the display driver 20 or the display panel 10 in which the display driver 20 is mounted can be built into a small electronic apparatus (not shown). Examples of the small electronic apparatus include cellular phones, PDAs, digital music players having a display panel and the like. In the display panel 10, for example, a plurality of display pixels are formed on a glass substrate 10A. Corresponding to the display pixels, a plurality of data lines (not shown) extending to the Y direction and a plurality of scan lines (not shown) extending to the X direction are formed on the display panel 10. In the embodiment, while the display pixel formed on the display panel 10 is a liquid crystal element, a light emitting element such as electroluminescent (EL) element may be applicable, not limited to the liquid crystal element. The display pixel also may be an active type associated with a transistor or the like, or a passive type without a transistor or the like. In a case where an active type is employed to a display region 12, an amorphous TFT and a low temperature polysilicon TFT may be used for the liquid crystal pixel.

The size of the display driver 20 is set by a length CX in the X direction and a length CY in the Y direction. The long side IL having a length of CX of the display driver 20 is in parallel with one side PL1, which is located adjacent to the display driver 20, of the display region 12. Namely, the display driver 20 is mounted to the display panel 10 so that the long side IL is in parallel with the one side PL1 of the display region 12.

Figure 1B:
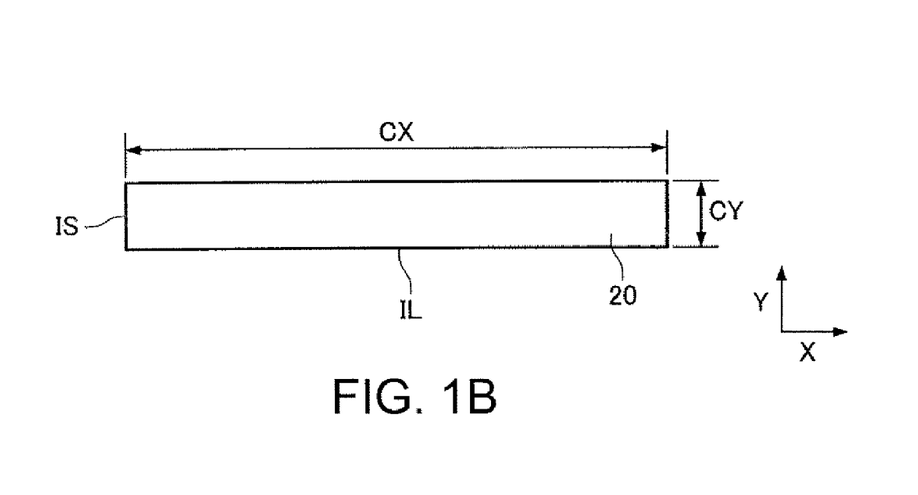

FIG. 1B shows the size of the display driver 20. The ratio of the short side IS having a length of CY to the long side IL of the display driver 20 is set so that the short side IS is markedly shorter than the long side IL, for example, IS:IL=1:9 to 1:11. By forming the driver 20 in such a long and thin shape, the size of the display driver 20 (chip size) in the Y direction can be reduced to the minimum.

As shown in FIG. 1A, the length LX of the display region 12 in the X direction is equal to the length CX of the display driver 20 in the X direction. While the lengths are not limited to those shown in FIG. 1A, it is preferable that the lengths LX and CX are set as being equal. The reason will be described with reference to FIG. 2A.

Figure 2A:
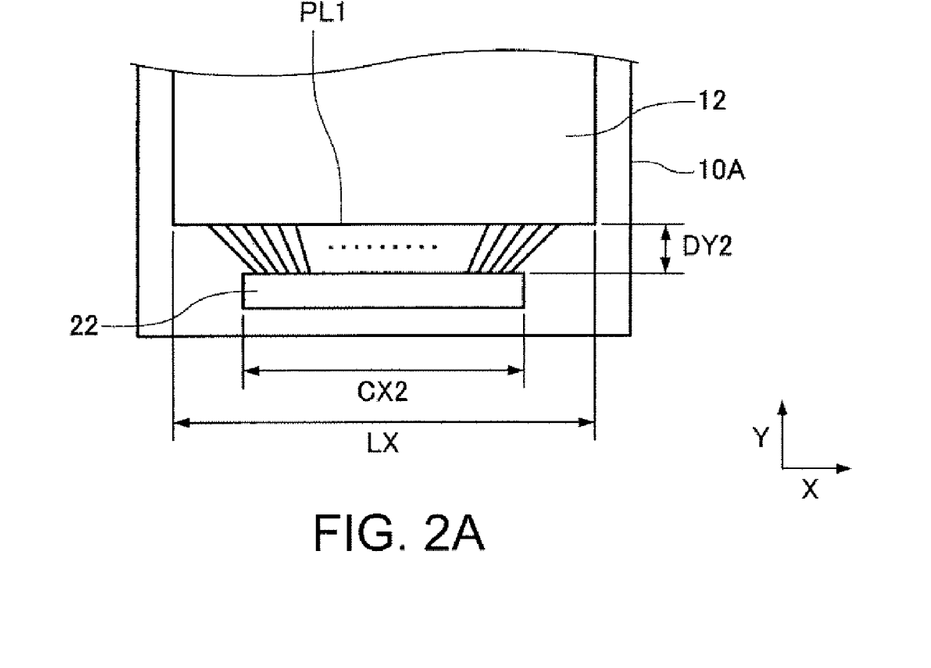
FIG. 2A shows a part of a comparative example to the embodiment of the invention.

In a display driver 22 shown in FIG. 2A, the length of the driver 22 in the X direction is set as CX2. The length CX2 is shorter than the length LX, which is the length of the one side PL1 of the display region 12. Thus, as shown in FIG. 2A, a plurality of wiring lines connecting the display driver 22 to the display region 12 cannot be provided so as to be in parallel with the Y direction. This setting needs to set the distance DY2 between the display region 12 and the display driver 22 longer than that in a case where the length CX of the display driver 22 in the X direction is equal to the length LX of the one side PL1 of the display region 12. This also requires an extra size in the glass substrate of the display panel 10 of the display panel 10, hampering cost reduction. In addition, if the display panel 10 is built into an electronic apparatus having a smaller size, the electronic apparatus is discouraged from miniaturization due to a large part excluding the display region 12.

Figure 2B:
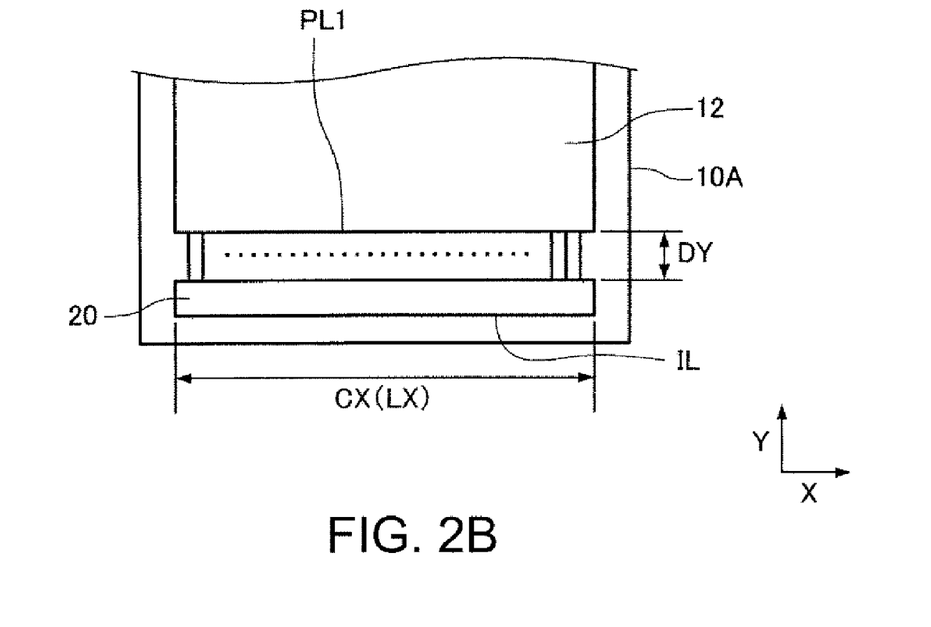
FIG. 2B shows a part of the integrated circuit device of the embodiment.

In contrast, in the display driver 20 of the embodiment, a plurality of wiring lines between the display driver 20 and the display region 12 can be provided so as to be in parallel with the Y direction as shown in FIG. 2B, since the length CX, which is the length of the long side IL, is equal to the length LX, which is the length of the one side PL1 of the display region 12. This makes it possible to shorten the distance DY between the display driver 20 and the display region 12 as compared with the case shown in FIG. 2A. Further, the size in the X direction of the glass substrate 10A of the display panel 10 is reduced since the length IS, which is the length in the Y direction of the display driver 20, is short. As a result, the resulting size can contribute to downsize an electronic apparatus.

While the length CX, which is the length of the long side IL of the display driver 20, is equal to the length LX, which is the length of the one side PL1 of the display region 12 in the embodiment, but the relation of lengths is not limited to this. For example, a case also shows the same effects in which the long side IL of the display driver 20 is longer than the length LX, which is the length of the one side PL1 of the display region 12.

Figure 3:
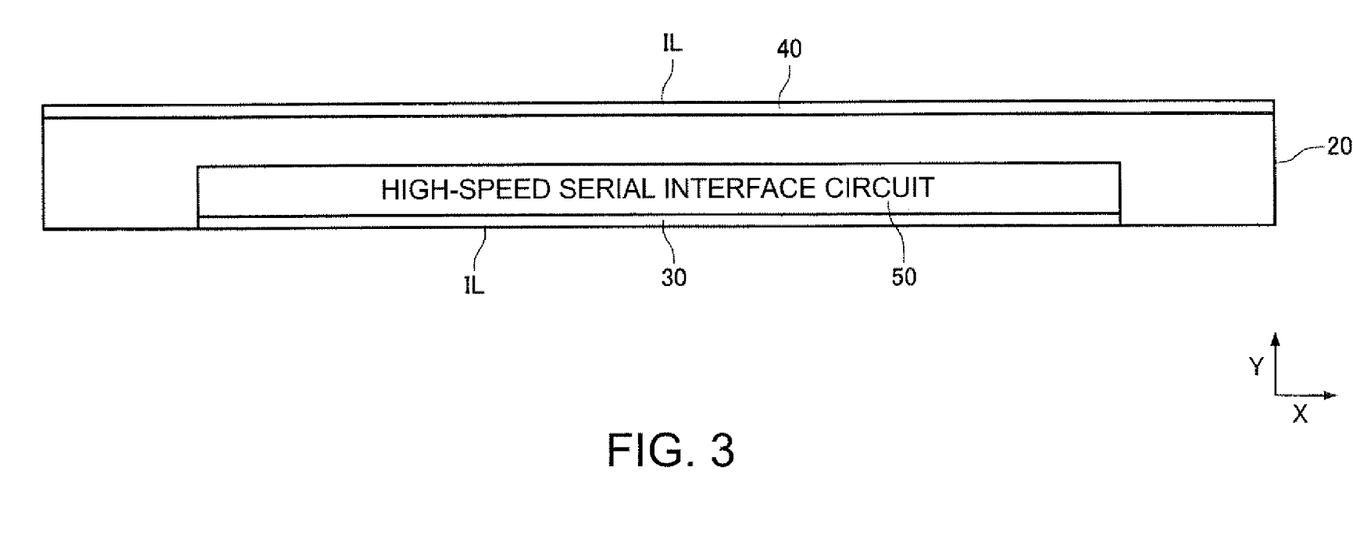
FIG. 3 shows a plan layout of a part of the integrated circuit device of the embodiment.

As shown in FIG. 3, an input pad region 30 and an output pad region 40 are provided along respective two long sides IL of the display driver 20. In addition, the display driver 20 includes a high-speed serial interface circuit (interface circuit in a broad sense) 50 provided in a region that is located an inside of the input pad region 30, and at a central region in the X direction along the long side IL. The reason why such arrangement is employed is that a data signal input into the high-speed serial interface circuit 50 is important. If the high-speed serial interface circuit 50 is located at the central region of the long side IL, pads connected to the circuit 50 are also disposed at the central region of the long side IL. In the embodiment, a bump is formed on the pad, and is connected to a pattern on a glass substrate with a conductive adhesive. The bump is more reliably connected at the central region than at both regions of the long side IL of the display driver 20. As a result, no data signal deficit occurs due to poor contact.

2. High-Speed Serial Interface Circuit

Figure 4:
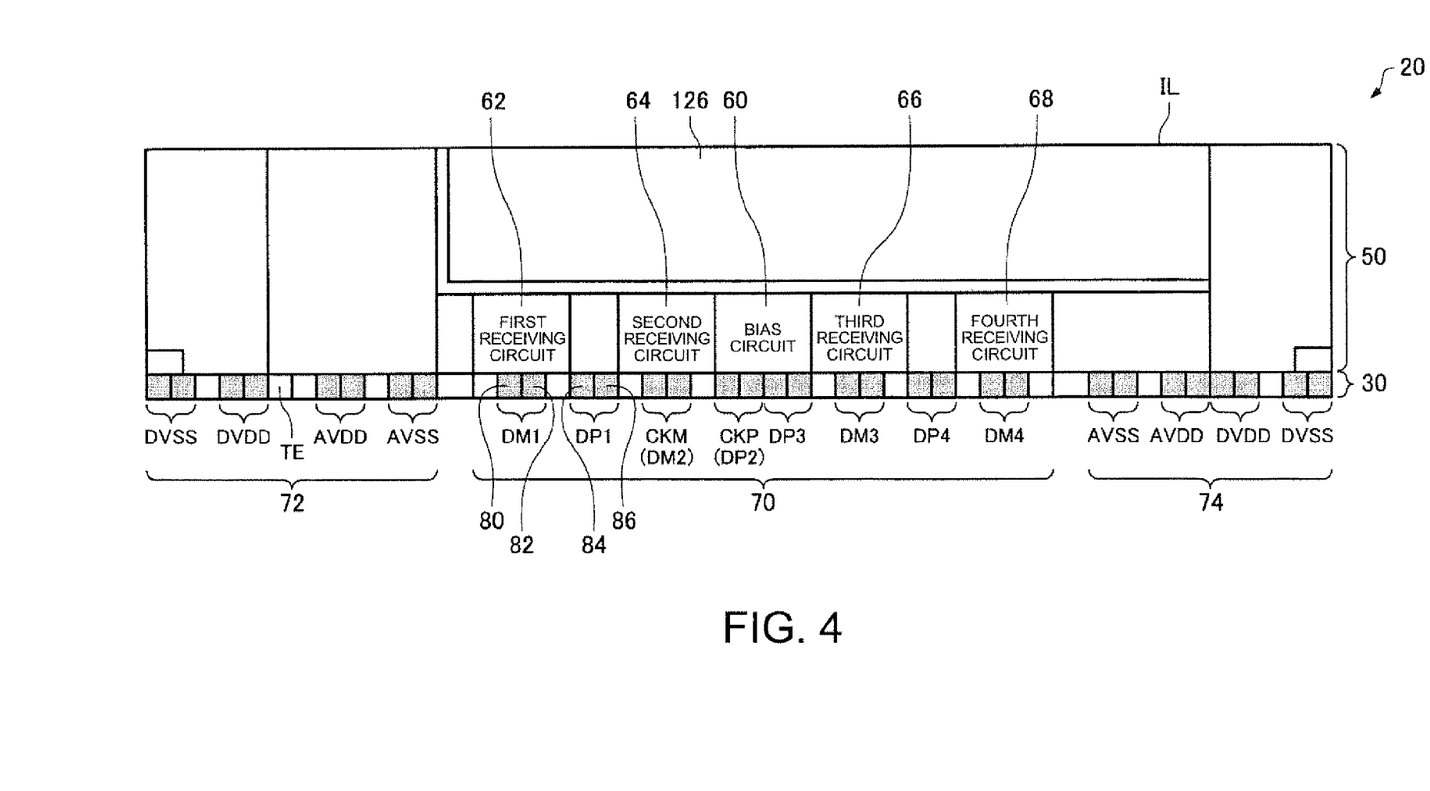
FIG. 4 is an enlarged plan view illustrating a high-speed serial interface circuit shown in FIG. 3 and an input pad region corresponding to the circuit.

FIG. 4 is an enlarged plan view illustrating the high-speed serial interface circuit 50 and the input pad region corresponding to the circuit 50. In the high-speed serial interface circuit 50, a bias circuit 60 is disposed at the central region of the long side IL of the display driver 20. For example, at both sides of the bias circuit 60, two receiving circuits are disposed at respective sides. Namely, a total of four receiving circuits are disposed as follows: a first receiving circuit 62; a second receiving circuit 64; a third receiving circuit 66; and a fourth receiving circuit 68. To the first receiving circuit 62 through the fourth receiving circuit 68, constant voltage is supplied from the bias circuit 60.

In the input pad region 30, the central region of the long side IL is a differential signal input region 70, while both sides of the region 70 are a first power supply input region 72 and a second power supply input region 74.

In the input pad region 30, 4 bumps are disposed corresponding to each of the first receiving circuit 62 through the fourth receiving circuit 68, i.e. a total of 16 bumps are provided. For example, 4 bumps 80, 82, 84, and 86 are disposed corresponding to the first receiving circuit 62. In the embodiment, the first receiving circuit 62 through the fourth receiving circuit 68 are receiving circuits of a pair of differential signals (DP, DM). A first pair of differential signals (DP1, DM1) is input to the first receiving circuit 62 through the bumps 80 through 86. A second pair of differential signals (DP2, DM2) is input to the second receiving circuit 64. A third pair of differential signals (DP3, DM3) is input to the third receiving circuit 66. A fourth pair of differential signals (DP4, DM4) is input to the fourth receiving circuit 68. Here, the second pair of differential signals (DP2, DM2) is a pair of differential signals for clock (CKP, CKM).

Figure 5:
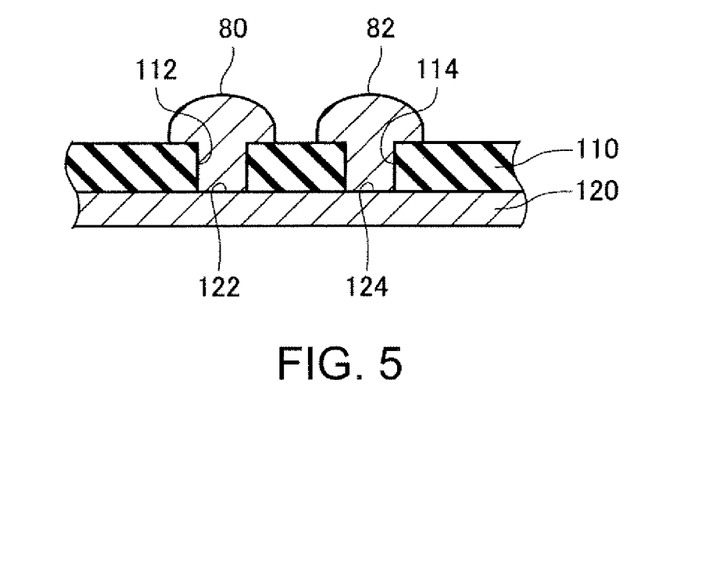
FIG. 5 is a cross sectional view illustrating a double-bump shown in FIG. 4.

As shown in FIG. 5, a pair of bumps adjacent each other, for example, bumps 80 and 82 are exposed from respective openings 112 and 114 both of which are disposed in a passivation film 110. The bumps 80 and 82 are formed with, for example, gold (Au) or the like on respective 2 pads 122 and 124 (a first and a second pads, or differential signal input pads in a broad sense) both of which are disposed on a metal layer 120 (a fifth metal layer in the embodiment), which is the uppermost layer. The pair of bumps 80 and 82 is a double-bump electrically connected to the metal layer 120. In the embodiment, the differential signal DM1, which is one of the first pair of differential signals (DP1, DM1), is input in common with the bumps 80 and 82.

Likewise, each of other pairs of bumps forms the electrically conducted double-bump to which a signal is input in common with the pairs of bumps.

At the both sides of these bumps for a pair of differential signals, a pair of bumps for an analog use VSS power supply (AVSS: a first power supply voltage in a broad sense) is disposed. The pair of bumps is connected to a first power supply voltage input pad (not shown). In addition, outside of the bumps for an analog use VSS power supply, a pair of bumps for an analog use VDD power supply (AVDD: a second power supply voltage in a broad sense) is disposed. The pair of bumps is also connected to a second power supply voltage input pad (not shown). In the power supply input region 72, a bump for a testing signal TE is disposed outside the pair of bumps for an analog use VDD power supply. A pair of bumps for a logic use VDD power supply (DVDD: a second power supply voltage in a broad sense) is disposed at each end side of the power supply input regions 72 and 74. The pair of bumps is also connected to the second power supply voltage input pad (not shown). In addition, outside of the bumps for a logic use VDD power supply, a pair of bumps for a logic use VSS power supply (DVSS: a first power supply voltage in a broad sense) is disposed. The pair of bumps is connected to a first power supply voltage input pad (not shown).

Accordingly, since the bumps for a pair of differential signals are structured as the double-bump, contact resistance at the midstream of a differential signal line is lowered so as to be low impedance. As a result, delay or corruption of a differential signal can be prevented. Further, the structure of the double-bump allows terminating resistance to be measured with high accuracy by using a four-terminal method in which each of bumps is individually used as a current supply terminal or voltage measurement terminal. The method will be described later.

Figure 6:
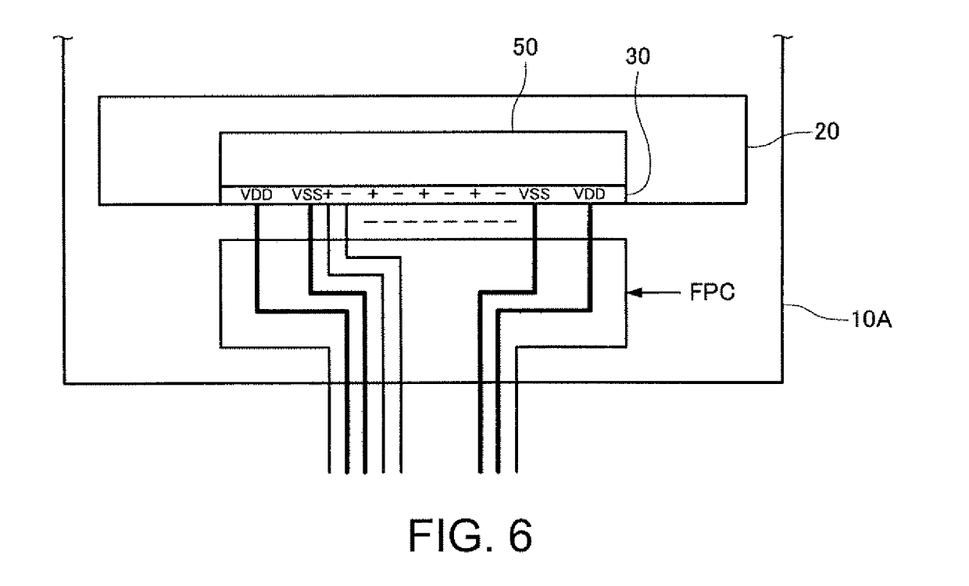
FIG. 6 shows a wiring pattern connecting a glass substrate on which a display driver is mounted and a flexible printed circuit board.

FIG. 6 schematically shows a condition in which the display driver 20 is mounted to the glass substrate 10A (a substrate in a broad sense) on which the display panel 10 is formed, and the display driver 20 is connected to a host (not shown) with a flexible printed circuit board FPC therebetween. In FIG. 6, a pattern shown therein is based on a case where a single bump is employed for the sake of convenience while the double-bump is employed in FIG. 4. In addition, only the analog use VDD and VSS are illustrated as the VDD and VSS without separating for analog use and logic use in FIG. 6.

As shown in FIG. 6, signal lines of four pairs of differential signals are arranged with power lines having constant potential, which are two VSS power supply lines in FIG. 6, sandwiching the signal lines on the glass substrate 10A and the flexible printed circuit substrate FPC as a result of employing a bump arrangement similar to that in FIG. 4. Here, a wiring pattern formed on the glass substrate 10A can only be achieved as a single layer, i.e. different patterns cannot cross. As a result, a pattern is inevitably arranged in accordance with a pad arrangement of the display driver 20. Furthermore, it is impossible to form multi-layered wiring such as a microstrip structure on the glass substrate 10A.

The amplitude of a differential signal input to the high-speed serial interface circuit 50 of the embodiment is too small to easily be affected by external noise since the signal is highly speeded by serial transfer. However, pairs of differential signal lines can be shielded by the VSS power supply lines sandwiching the signal lines with an arrangement shown in FIG. 6. In the arrangement, the VSS power supply line is disposed at respective both sides of four sets of pairs of differential signal lines (in a case of the double-pad, two VSS power supply lines are disposed at respective both sides). Consequently, EMI noise measures can be taken to external noise, and furthermore, voltage noise measures achieved by shielding effect of electric field and current noise measures achieved by shielding effect of magnetic field can be practically taken.

3. Terminating Resistance

Figure 7:
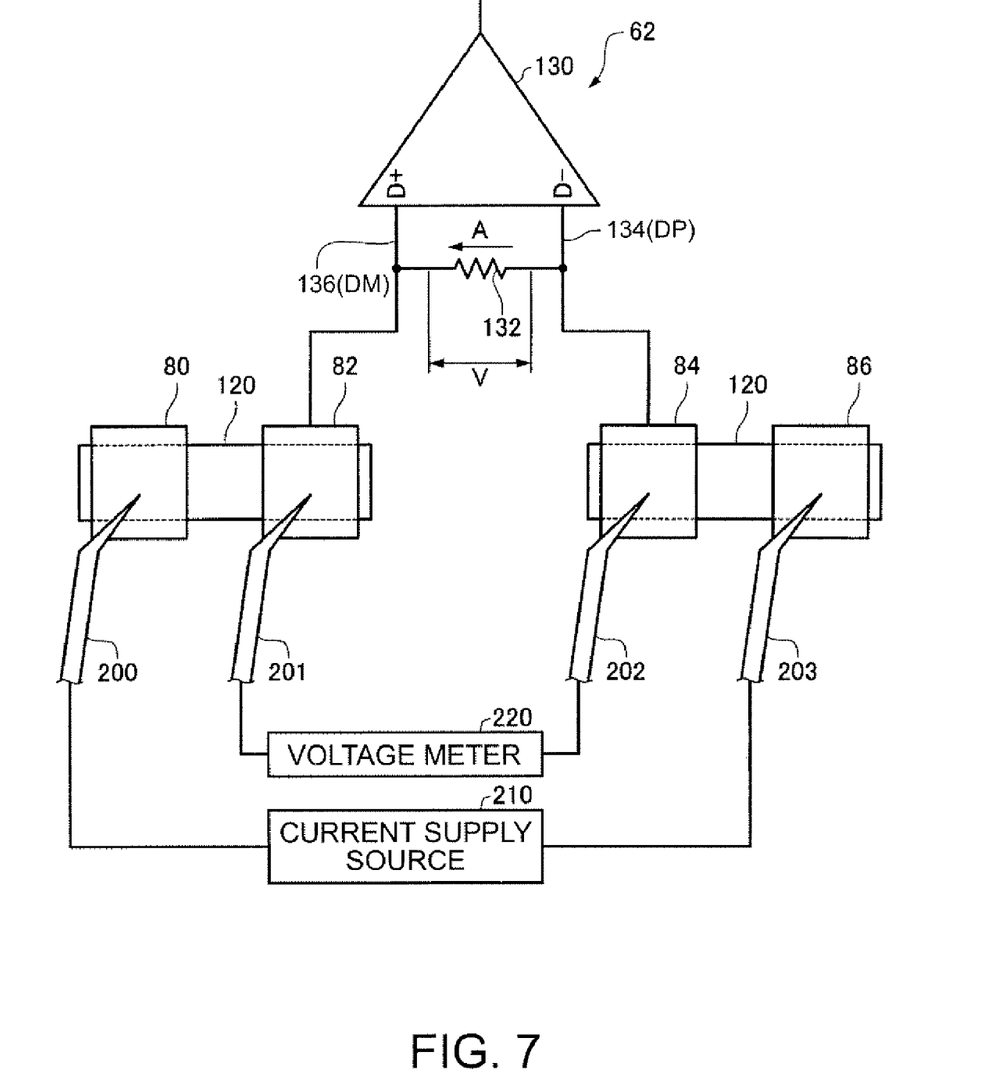
FIG. 7 shows a receiving circuit having a terminating resistor and a four-terminal method to measure the terminating resistor.

Each of the first receiving circuit 62 through the fourth receiving circuit 68 that are shown in FIG. 4 has a differential comparator 130 as shown in FIG. 7. A DP signal line 134 and a DM signal line 136 are connected to the comparator 130. A terminating resistor 132 connects the DP signal line 134 with the DM signal line 136. The terminating resistor 132 requires, for example, 100Ω in its resistance value as a requirement from a standard. The terminating resistor, which is provided at the termination of wiring, prevents signal reflections (unwanted reflections) at the termination so as to prevent signal waves from being disturbed. Namely, the termination resistor matches signal source impedance with load impedance.

Figure 8:
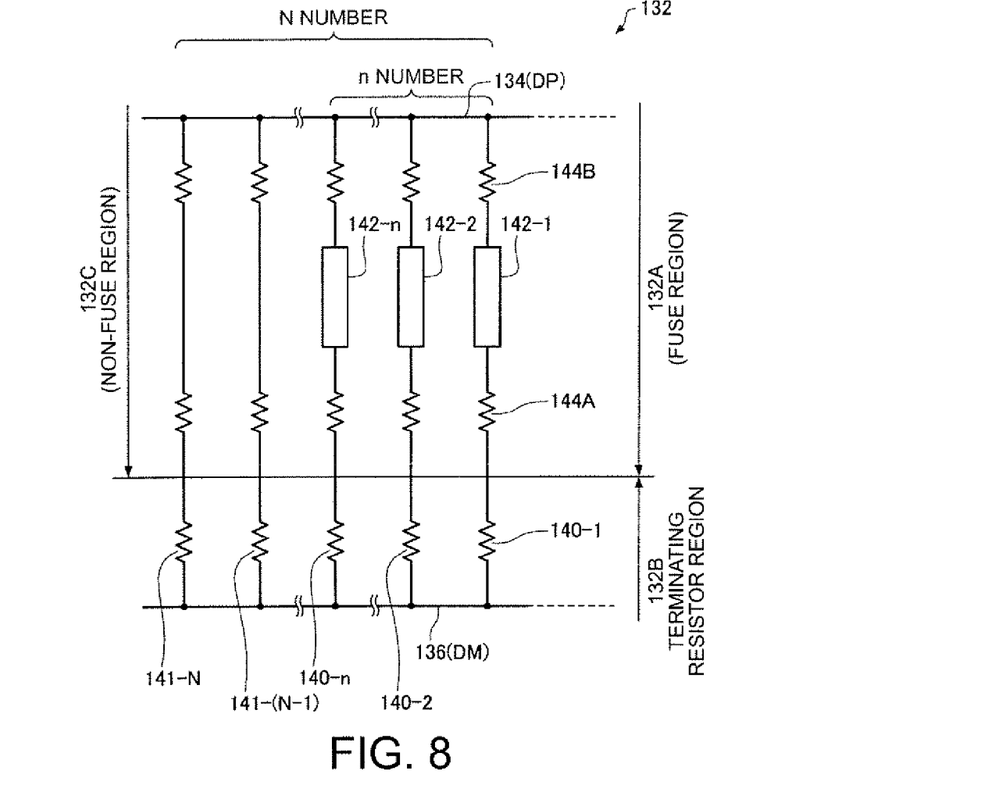
FIG. 8 shows an example of circuit structure of the terminating resistor shown in FIG. 7.

In FIG. 8, an example of circuit structure of the terminating resistor 132, for example, which requires 100Ω in its resistance value. As shown in FIG. 8, the terminating resistor 132 includes a fuse region 132A, a terminating resistor region 132B, and a non-fuse region 132C. The terminating resistor region 132B includes a first resistance element 140-1 through an $N^{th}$ resistance element 140-N that are parallel connected between the DP signal line 134 and the DM signal line 136. In the resistance elements, each of a first fuse element (a cut element in a broad sense) 142-1 through an $n^{th}$ fuse element 142-n is respectively connected to each of the first resistance element 140-1 through an $n^{th}$ ($1 \leq n < N$) resistance element 140-n.

Here, the following relation is satisfied: L/N<M<L/(N−n) where M (Ω) is a designed resistance value of the terminating resistor 132, and L (Ω) is each designed resistance value of the first through $N^{th}$ resistance elements.

For example, if M=100Ω, L=2000Ω, N=25, and n=10, the above inequality is satisfied as follows: L/N=80<M=100<L/(N−n)=133.3

Figure 9:
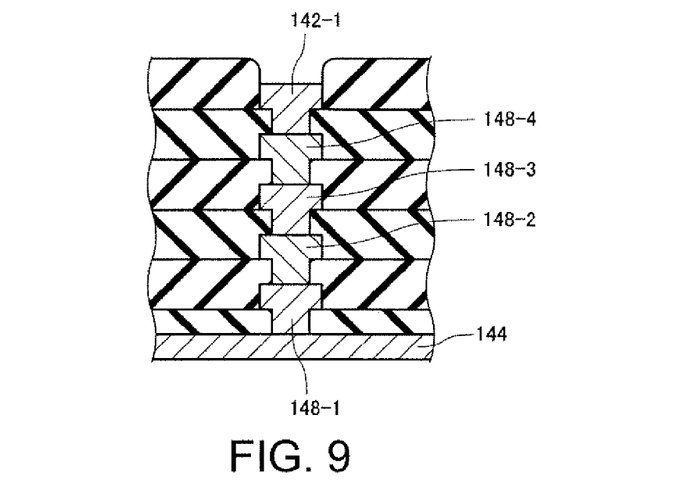
FIG. 9 is a sectional view illustrating one end of a fuse shown in FIG. 8.

The first fuse element 142-1 through the $n^{th}$ fuse element 142-n are formed by the uppermost metal layer (in the embodiment, in the fifth metal layer) so that they can be laser trimmed in adjusting a terminating resistance value. However, as described later in FIG. 10, a ringed metal wiring line 160 (not shown in FIG. 8), which is a multilayer and composed of a first metal layer through the fifth metal layer each having a ringed shape in a plan view, is disposed around the first fuse element 142-1 through the $n^{th}$ fuse element 142-n. Therefore, redundant wiring is indispensable so that wiring lines are drawn out from the fuse elements 142-1 through 142-n by avoiding the ringed metal wiring line 160 surrounding the elements. The redundant wiring means that as shown in FIG. 9, each one end of the first fuse element 142-1 through the $n^{th}$ fuse element 142-n is connected to a polysilicon layer 144 (non-metal wiring layer in a broad sense) through a first via 148-1 through a fourth via 148-4. The polysilicon layer 144 functions as a resistance layer.

From the above-described reason, as shown in FIG. 8, a polysilicon resistance element 144A (a first non-metal resistance element in a broad sense) and a polysilicon resistance element 144B (a second non-metal resistance element in a broad sense) exist at both ends of each of the first fuse elements 142-1 through the $n^{th}$ fuse element 142-n. Accordingly, 2000Ω plus a polysilicon resistance value exists each of parallel lines. Further, each resistance value of the first resistance element 140-1 through the $N^{th}$ resistance element 140-N, and polysilicon resistors 144A and 144B are different in each of the parallel lines due to manufacturing variations. Parasitic resistance also exists in each of the parallel lines.

From the above-described reason, when the designed resistance value L of each of the first resistance element 140-1 through the $N^{th}$ resistance element that are parallel connected is 2000Ω, the resistance value of the terminating resistor 132 is not always the designed resistance value of M of 100Ω even if a total of 20 resistor elements 140-1 through 140-20 are used with cutting some fuse elements. Consequently, in the embodiment, for example, the resistance value of the terminating resistor 132 can be adjusted as follows: one fuse element is connected in series with each of 10 resistance elements (n=10) that are chosen from 25 resistance elements (N=25) parallel connected, i.e. the first resistance element 140-1 through the $25^{th}$ resistance element 140-25; and any of n number of fuse elements is cut while measuring the resistance value of the terminating resistor 132.

It is preferable that the lower limit of designed resistance value of the first resistance element 140-1 through the $N^{th}$ resistance element 140-N is set so that the value can almost neglect the total value of the polysilicon resistance (in the embodiment, over ten ohms) at both sides of each of the first fuse element 142-1 through the $n^{th}$ fuse element 140-n. The upper limit of the designed resistance value of the first resistance element 140-1 through the $N^{th}$ resistance element 140-N is set in relation to the number of parallel connections N. The more the number N, a region for arranging the first resistance element 140-1 through the $N^{th}$ resistance element 140-N is more widened. In the embodiment, taking two limits into consideration, the designed resistance value of the first resistance element 140-1 through the $N^{th}$ resistance element 140-N is in the order of thousand e.g. 2000Ω. This value is larger by two digits than the polysilicon resistance value, which is in the order of two digits (a few tens) e.g. 16.5Ω, at one end of each of the first fuse element 142-1 through the $n^{th}$ fuse element 140-n. Obviously, the designed resistance value of the first resistance element 140-1 through the $N^{th}$ resistance element 140-N can also be set to be a value larger than the designed resistance value i.e. 16.5Ω of the first fuse element 142-1 through the $n^{th}$ fuse element 140-n by more than one digit.

Figure 10:
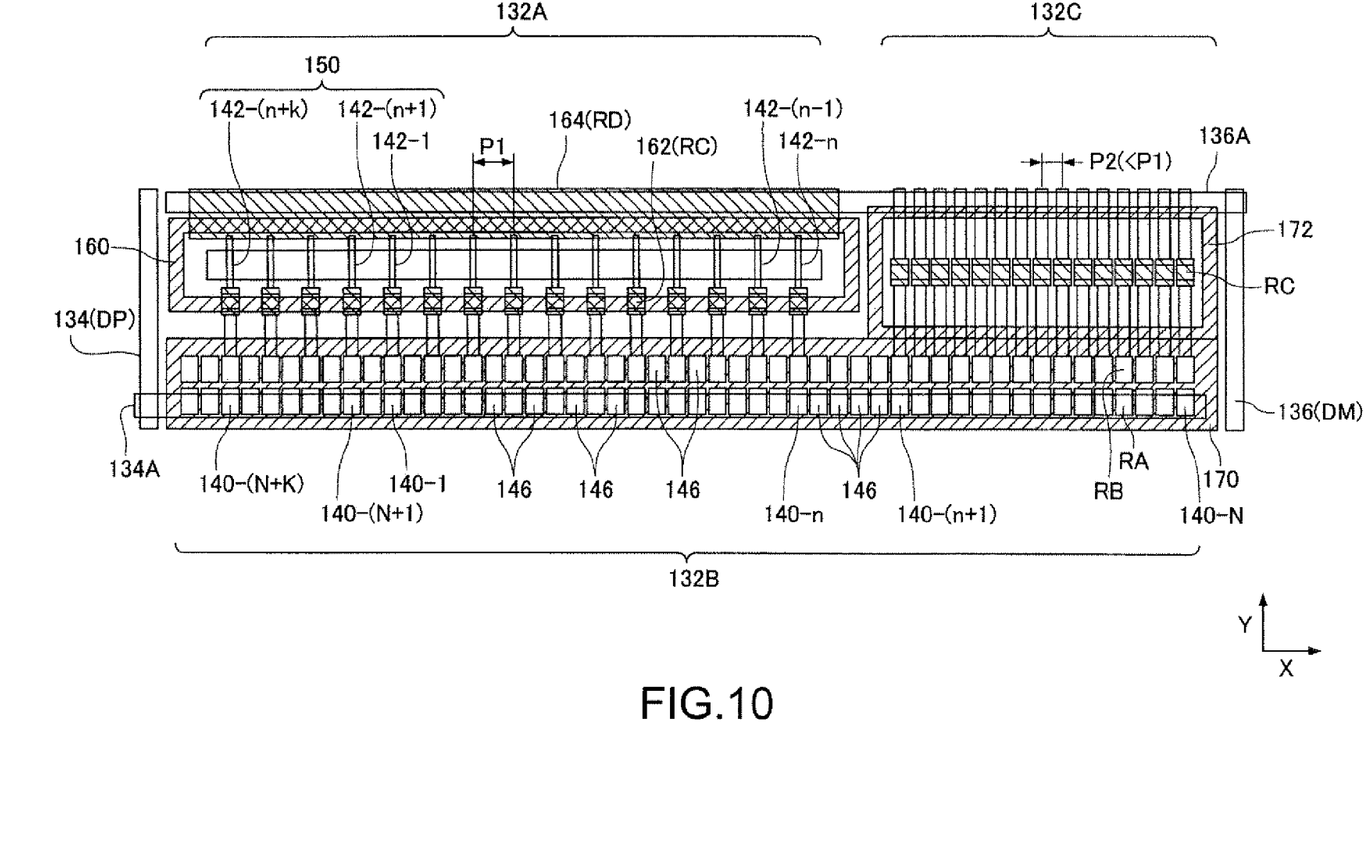
FIG. 10 is a plan layout of the terminating resistor shown in FIG. 8.
Figure 11:
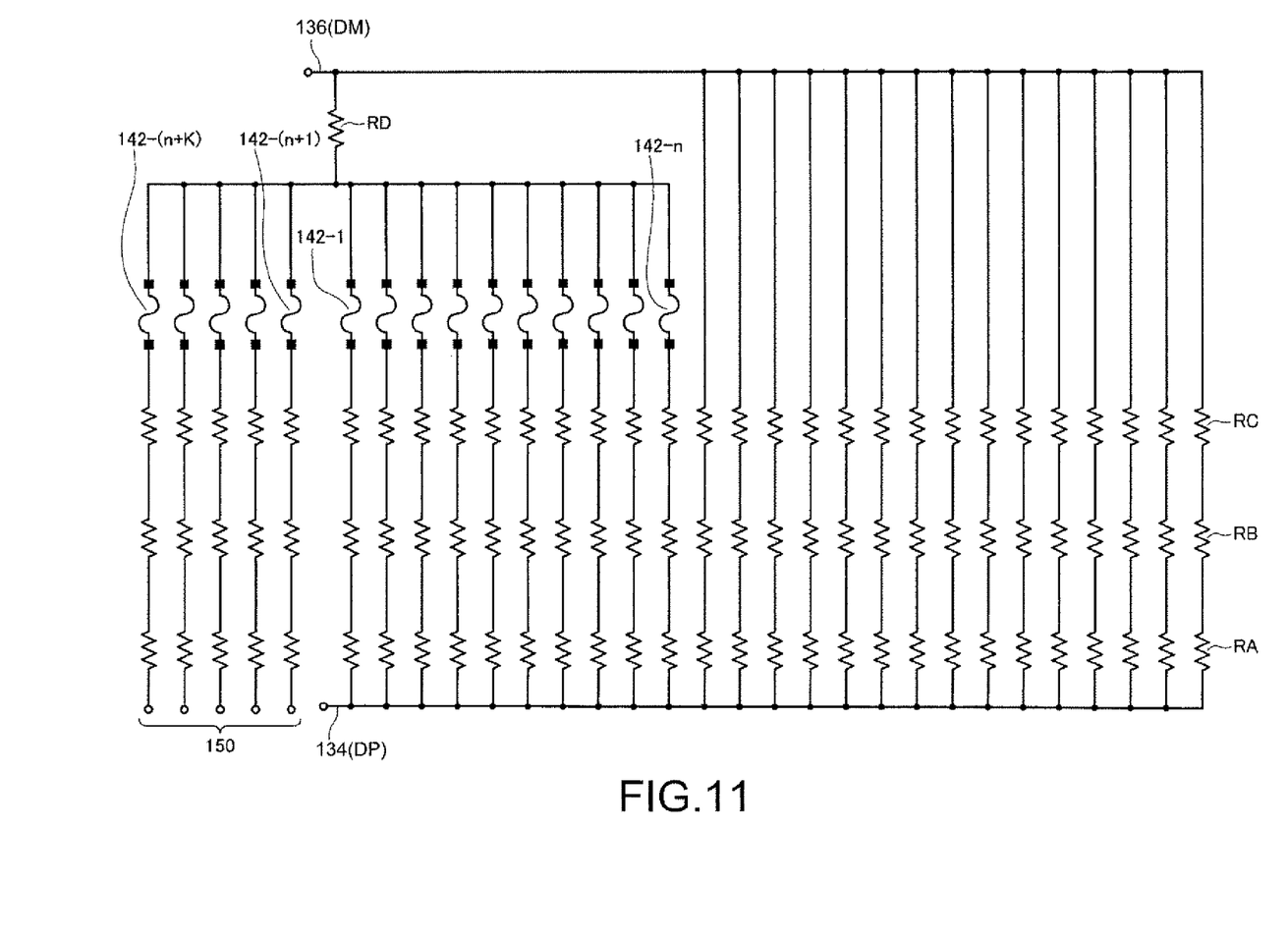
FIG. 11 is a circuit diagram of the terminating resistor shown in FIG. 10.

FIG. 10 shows an example of pattern layouts of the terminating resistor 132, while FIG. 11 shows its equivalent circuit. In each figure, resistors RA, RB, and RC are connected in series with each of N number of parallel lines arranged between the DP signal line 134 and the DM signal line 136. The resistors RA and RB are included in each of the first resistance element 140-1 through the $N^{th}$ resistance element 140-N shown in FIG. 8. Namely, RA and RB are designed so as to satisfy the following: RA+RB=1000Ω+1000Ω=2000Ω. In contrast, the resistor RC (e.g. resistance value is 16.5Ω) forms the polysilicon resistor 144A in FIG. 8. In the embodiment, the resistor RD is connected to one end of n number of fuse elements 142-1 through 142-n in common. Since the resistance value of the resistor RD is small (e.g. 0.3Ω), the resistor RD is not provided to (N-n) number of parallel lines to which the first fuse element 142-1 through the $n^{th}$ fuse element 142-n are not connected. Note that N number of parallel lines, excluding n number of fuse elements 142-1 through 142-n, are arranged so as to have the same resistance value in all lines, and manufactured in the same process.

In FIGS. 10 and 11, k (k is a natural number e.g. k=5) number of spare lines 150, which are not shown in FIG. 8, are provided. One ends of k number of spare lines 150 are not connected to the DP signal line 134 as shown in FIG. 11. Note that each of k number of spare lines 150 has the same structure as that of each of n number of parallel lines having fuse elements, except in that the spare lines 150 are not connected to the DP signal line 134.

In FIG. 10, a number of resistors RA and RB are respectively arranged along the X direction at an equal pitch. The number of resistors RA is more than the number of parallel lines including k number of spare lines 150, i.e. (N+k). The reason is as follows. An arranging pitch P1 of (n+k) number of fuse elements 142-1 through 142-n is larger than an arranging pitch P2 of the parallel lines including no fuse elements. Accordingly, if the resistors RA and RB are provided in the number that corresponds to (N+k) number of parallel lines, the arranging pitch is large in a region where the resistors RA and RB, which are connected to (n+k) number of fuse elements 142-1 through 142-n, are arranged, while the arranging pitch becomes small in a region where the resistors RA and RB, which are connected to (N−n) number of parallel lines, are arranged. If doing this way, accuracy in patterning the resistor RA and RB is deteriorated, resulting in the variation between the parallel lines being large. Therefore, in the embodiment, the pitch P1 is set as an integral multiple of the pitch P2, e.g. P1=2×P2. A part of the resistors RA and RB, which are arranged at an equal pitch, is used as a dummy resistance element 146 to which no wiring line is connected. As a result, each of the resistors RA and RB can be manufactured to be 1000Ω as a designed value with relatively high accuracy.

Here, a DP wiring line 134A, which is connected to the DP signal line 134 extending in the Y direction, and extends in the X direction, and the resistor RA are connected through a via. If no via is provided between the dummy resistance element 146 and the DP signal line 134, k number of spare lines 150 can be achieved as the equivalent circuit shown in FIG. 11. The number of parallel lines can be changed by providing a via between the DP wiring line 134A and any of k number of spare lines 150 in a manufacturing process if necessary. The changing of the number of the parallel lines can be carried out in a process such as sample stage prior to mass production, or a pilot process before mass production.

The ringed metal wiring line 160 composed of the first through the fifth metal layers is disposed around (n+k) number of fuse elements 142-1 through 142(n+k) so that fuse elements are easily cut by improving moisture-absorption characteristics of a fuse region. Accordingly, the resistance element 162 (RC) (a first non-metal resistance element in a broad sense) is formed by a polysilicon layer 162 (non-metal wiring layer in a broad sense), which is an underlayer of the ringed metal wiring line 160, at each one end of (n+k) number of fuse elements 142-1 through 142(n+k). The resistance element 164 (RD) (a second non-metal resistance element in a broad sense) is formed by a polysilicon layer 164 (non-metal wiring layer in a broad sense), which is an underlayer of the ringed metal wiring line 160 and has a large area, at each other end of (n+k) number of fuse elements 142-1 through 142(n+k). The polysilicon layer 164 is connected to a DM wiring line 136A, which is connected to the DM signal line 136 extending in the Y direction, and extends in the X direction, through a via.

Likewise, a ringed wiring line 170 is disposed in the terminating resistor region 132B, while a ringed wiring line 172 is disposed in the non-fuse region 132C as shown in FIG. 10. In the non-fuse region 132C, the resistance element RC (a third non-metal resistance element in a broad sense), which is formed by a polysilicon layer (non-metal layer in a broad sense), is disposed in the same way of that of the fuse region 132 A. One end of the element RC is connected to the DM wiring line 136A through a via.

4. Adjusting Method of Terminating Resistor.

A measuring method by a four-terminal method will be described on the terminating resistor 132 of the first receiving circuit 60 as an example with reference to FIG. 7. Each of a first prove 200 through a fourth probe 203 is touched to respective 4 bumps 80, 82, 84, and 86 for the receiving circuit 60. A current supply source 210 is connected to the first probe 200 and the fourth probe 203. A current A flows from the current supply source 210 to the first probe 200 through the fourth prove 203, the bump 86, the bump 84, the DP signal line 134, the terminating resistor 132, the DM signal line 136, the bump 82, and the bump 80 in this order. In this case, a voltage drop V across the terminating resistor 132 is measured by a voltage meter 220 through the bumps 82 and 84, and a second probe 201 and a third probe 202. Accordingly, the resistance of the terminating resistor 132 is obtained by formula of R=V/A. Particularly, the resistance value of the terminating resistor 132 can be measured with high accuracy by setting the current A as about 3 mA the same as that in practical operation.

Figure 12:
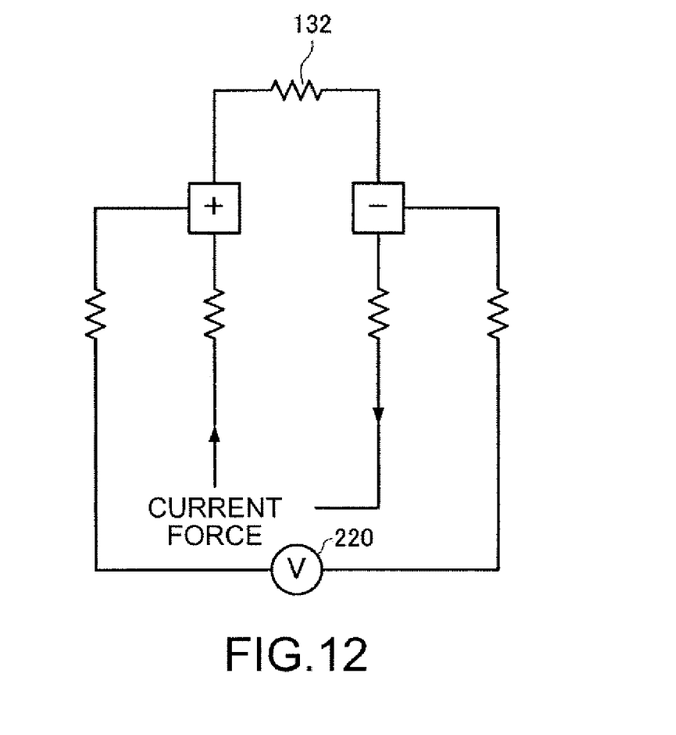
FIG. 12 is a schematic explanatory view of a two-terminal method measuring the terminating resistor.

In contrast, one terminal is used in common with a current supply terminal and a voltage supply terminal in a two-terminal method shown in FIG. 12. In the two-terminal method, the voltage measurement by the voltage meter 220 is required to take resistances in a measurement system into consideration since a current flows in the measuring system including the voltage meter 220. In addition, a voltage cannot be measured by a current in practical operation by the two-terminal method since a current in the order of milli-ampere, which is a current flowed in a device in its practical operation e.g. 1.5 to 3 mA, cannot be flowed. Further, even if 2 probes are forcedly tried to touch them to each of 2 bumps as shown in FIG. 12, the 2 probes are touched one another. As a result, it is impossible to realize the measurement by the four-terminal method.

Adjusting the terminating resistor 132 is carried out as follows as an example. The resistance value of the terminating resistor 132 is measured without cutting any of the first fuse element 142-1 through the $n^{th}$ fuse element 142-n. In this case, the measured value of the terminating resistor 132 is obviously above 100Ω, which is a value to be adjusted. Then, any one of or a plurality of the first fuse element 142-1 through the n$^{th}$ fuse element 142-n is cut by laser trimming based on the difference between the value to be adjusted and the measured value. In the embodiment, each resistance value of the 25 parallel lines (N=25) is approximately 2000Ω, and an adjustable range per one line of the parallel lines is 4%. Therefore, how many fuse elements needs to be cut can be determined based on the adjustable range.

The resistance elements of each line in the terminating resistor region 132B show small variation since they are manufactured in the same process. Even if variation occurs between lots, variation is stable in a lot. Accordingly, the resistance value per line can be calculated in accordance with the presence or nonpresence of the fuse element based on the measured result of the terminating resistor. As a result, how many fuse elements needs to be cut can easily be calculated in order to obtain a targeted terminating resistance value.

Alternatively, the adjustment of the terminating resistor can be carried out with a mask for metal wiring instead of a cutting element such as a fuse. In a process such as a sample stage prior to mass production, or a pilot process before mass production, the terminating resistor may be adjusted as follows: the terminating resistor of a product is measured; and a metal wiring line at a part where a fuse is replaced to the metal wiring is set whether or not the line at the part is connected with a mask for metal wiring based on the measured value. This makes it possible to adjust the terminating resistor with one mask for metal wiring without a fuse cutting process though a circuit size becomes large. In addition, adjusting the terminating resistor with a mask for metal wiring enhances increasing throughput and easily copes with process variations. However, this method is inferior to the adjustment by cutting fuse in accuracy of a resistance value adjustment since the adjustment is carried out based on the resistance value of a sample or a lot prior to mass production.

5. Modification

As understood by those skilled in the art, various changes can be made with the embodiment of the invention that has been described in detail without departing from the spirit and scope of the invention. All of such changes are to be regarded to be in the scope of the invention. For example, terms referred as broader or equivalent terms in the specification and drawings can be replaced with the broader or equivalent terms in any part of the specification and drawings.

The interface circuit according to the invention is not limited to the interface circuit in the liquid crystal driver IC described above. The interface circuit of the invention can also be applied to USB, IEEE1394, and OTG.

Figure 13:
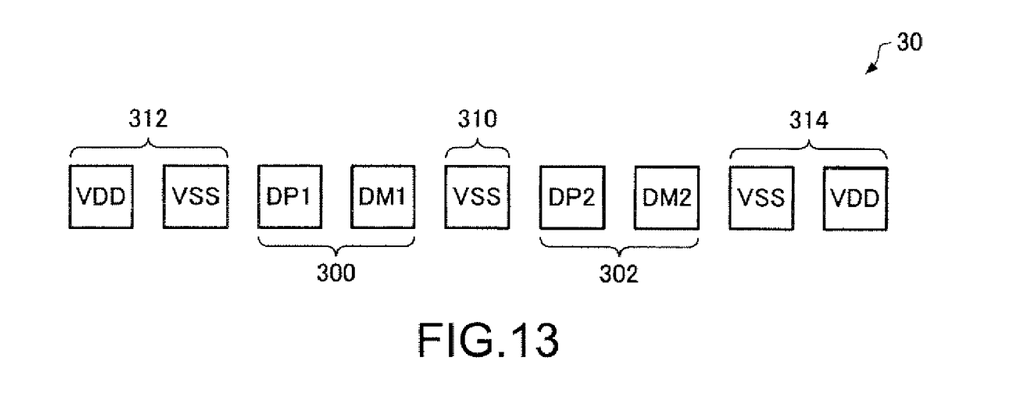
FIG. 13 shows a modification example of a bump arrangement shown in FIG. 6.

Here, FIG. 13 shows a modification of the bank arrangement in FIG. 6. In the input pad region 30, 2 differential signal regions 300 and 302 each of which has banks for the first pair of differential signals (DP1, DM1) and the second pair of differential signals (DP2, DM2). A pair of differential signals is input to each bank. In a first power supply input region 310, which is located between the differential signal regions 300 and 302, only a bump for VSS power supply voltage (first power supply voltage in a broad sense) is provided. In 2 second power supply input regions 312 and 314, which are located both end parts in the direction along one side of the interface circuit 50, a bump (first power supply input bump in a broad sense) to which VSS power supply voltage is input, and a bump (second power supply input bump in a broad sense) to which VDD power supply voltage is input are provided.

This arrangement allows, for example, the first power supply input region 310 and the second power supply input region 312 are indispensably located at both sides of a pair of differential signals (DP1, DM1). As a result, crosstalks between a plurality of pairs of differential signals (DP1, DM1 and DP2, DM2) can be prevented. In addition, characteristic impedance to at least a pair of differential signals (DP, DM) can be adjusted by using a VSS wiring line for VSS power supply voltage on the glass substrate 10A on which the display driver 20 is mounted. Namely, the characteristic impedance to the pair of differential signals (DP, DM) can be adjusted by the space between a differential signal line and the VSS wiring line, or the thickness or width of the VSS wiring line adjacent to the differential signal line.

Figure 14:
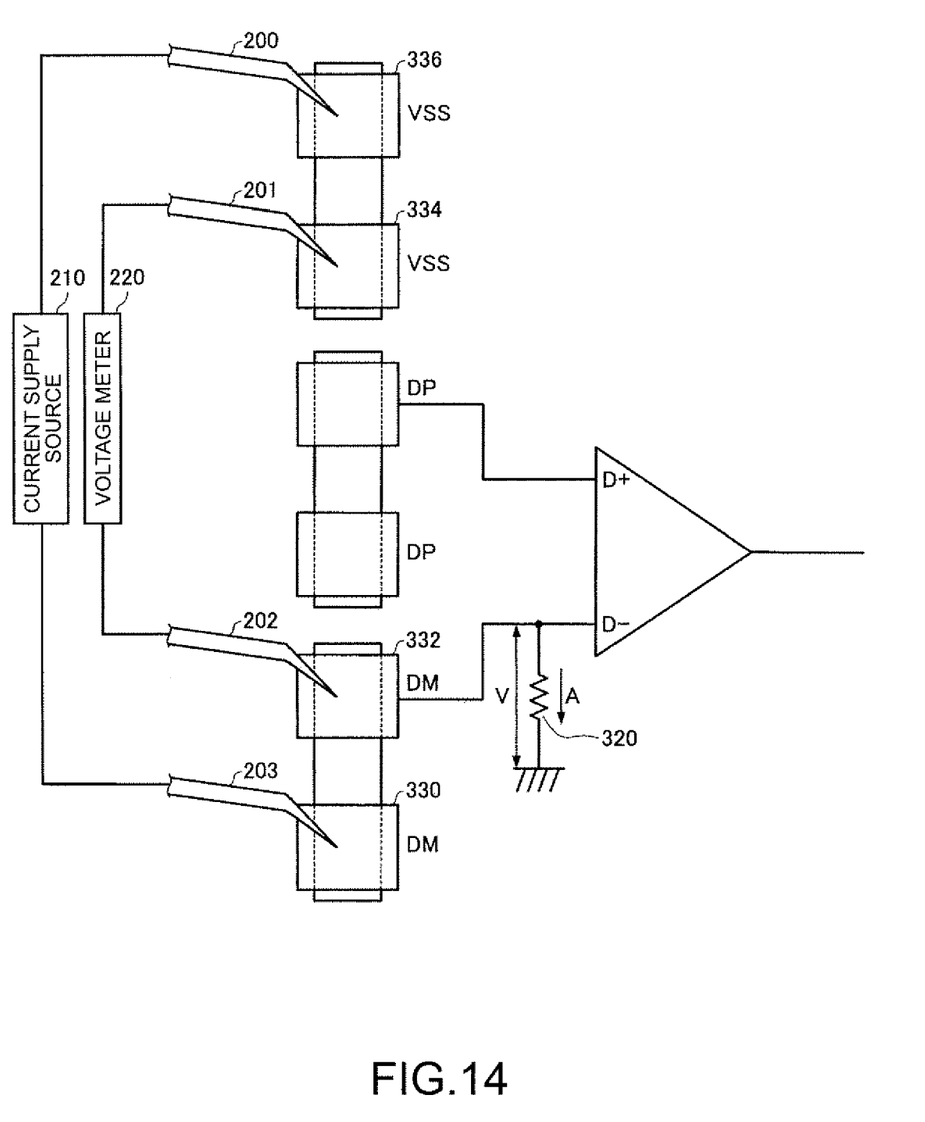
FIG. 14 is an explanatory view illustrating a measurement of a pull down resistor as a modification example of FIG. 7.

FIG. 14 shows an example of measuring a pull down resistor 320 of a receiving circuit different from that in FIG. 7. In this case, the current A from the current supply source 210 flows to the ground point through the probe 203, a bank 330, and the pull down resistor 320. In this regard, the probe 200 does not necessarily contact the bank 336 if the current supply 210 has a ground terminal. However, in a case where the probe 200 is contacted to the bank 336 for the VSS power supply source, measuring accuracy is improved due to ground impedance matching. The voltage drop V caused by the current A is measured by the voltage meter 220 connected to the pull down resistor 320 through the probes 201 and 202.

Likewise, a pull up resistor also can be measured.

This entire disclosure of Japanese Patent Application No. 2005-197930, filed Jul. 6, 2005 is expressly incorporated by reference herein.

What is claimed is:

1. An integrated circuit device, comprising:
   an input pad region including a differential signal input region receiving a pair of differential signals, a first power supply input region and a second power supply input region; and
   an interface circuit including a receiving circuit receiving the pair of differential signals that are input from the input pad region,
   the first power supply input region including at least two power supply pads,
   the second power supply input region including the at least two power supply pads, and
   the first power supply input region and the second power supply input region being disposed in a direction along one side of the interface circuit so as to sandwich the differential signal input region.

2. The integrated circuit device according to claim 1, each of the first power supply input region and the second power supply input region including a first power supply voltage input pad to which a first power supply voltage is input, and a second power supply voltage input pad to which a second power supply voltage higher than the first power supply voltage is input.

3. The integrated circuit device according to claim 2, the first power supply voltage input pad being disposed so as to be closer to the differential signal input region than the second power supply voltage input pad in each of the first power supply input region and the second power supply input region.

4. The integrated circuit device according to claim 2, the differential signal input region including a first differential signal input pad to which one of the pair of differential signals is input and a second differential signal input pad to which the other of the pair of differential signals is input.

5. An electronic apparatus, comprising:
   the integrated circuit device according to claim 4; and
   a substrate on which the integrated circuit device is mounted, the substrate having a signal pattern composed of a single layer, the signal pattern being patterned in accordance with an arrangement order of the first differential signal input pad, the second differential signal input pad, the first power supply voltage input pad, and the second power supply voltage input pad that are arranged in the input pad region of the integrated circuit device.

6. The electronic apparatus according to claim 5, the substrate being a glass substrate having the signal pattern.

7. The electronic apparatus according to claim 5, the substrate including a flexible circuit substrate connected to the signal pattern.

8. An integrated circuit device, comprising:
an input pad region including:
a plurality of differential signal regions each having a first differential signal input pad and a second differential signal input pad that receive a pair of differential signals; and
first through $m^{th}$ power supply regions including a $k^{th}$ power supply region, the regions being arranged in a direction along one side of the interface circuit so as to sandwich each of the plurality of differential signal regions; and
an interface circuit including a receiving circuit receiving a pair of differential signals that are input from the input pad region,
each of the first power supply region and the mth power supply region is being disposed at respective end parts in the direction, and having a first power supply voltage input pad to which a first power supply voltage is input, and a second power supply voltage input pad to which a second power supply voltage higher than the first power supply voltage is input, and the $k^{th}$ power supply input region disposed between the differential signal regions so as to be sandwiched having at least the first power supply input pad, where m is a natural number of more than two, and k is a natural number of more than one and less than m.

9. The integrated circuit device according to claim 8, each of the first differential signal input pad, the second differential signal input pad, the first power supply voltage input pad, and the second power supply voltage input pad including a first pad and a second pad both of which are electrically conducted and each of two probes makes contact with each of the first pad and the second pad.

10. The integrated circuit device according to claim 8, the interface circuit including a terminating resistor connected to the first differential signal input pad and the second differential signal input pad.

11. The integrated circuit device according to claim 8, the terminating resistor including first through Nth resistors that are parallel connected, and first through nth cutting elements each of which is connected in series with each of n number of resistors in the first through Nth resistors where N is an integer more than one and n satisfies the relation of $1 \leq n < N$.

12. The integrated circuit device according to claim 10, the interface circuit including a pull down resistor connected to one of the first differential signal input pad and the second differential signal input pad.

13. The integrated circuit device according to claim 10, the interface circuit including a pull up resistor connected to one of the first differential signal input pad and the second differential signal input pad.

14. The integrated circuit device according to claim 9, a bump being formed on each of the first pad and the second pad.

15. An electronic apparatus, comprising:
the integrated circuit device according to claim 14; and
a substrate on which the integrated circuit device is mounted with the bump included in the integrated circuit device, the substrate having a signal pattern composed of a single layer, the signal pattern being patterned in accordance with an arrangement order of the first differential signal input pad, the second differential signal input pad, the first power supply voltage input pad, and the second power supply voltage input pad that are arranged in the input pad region of the integrated circuit device.

* * * * *